(12) United States Patent  
Morganstern et al.

(10) Patent No.: US 7,303,411 B1  
(45) Date of Patent: Dec. 4, 2007

(54) ELECTRONIC DEVICE WITH A RETRACTABLE CONNECTOR AND PROTECTIVE DOOR MECHANISM

(75) Inventors: Michael Alan Morganstern, Saratoga, CA (US); Derek Niizawa, Sunnyvale, CA (US); Jeffrey A. Salazar, Palo Alto, CA (US); Junggi Sung, San Francisco, CA (US); Michael L. Simmons, San Francisco, CA (US); Arturo Meuniot, San Francisco, CA (US); Michael S. Roberts, San Francisco, CA (US)

(73) Assignee: SanDisk Corporation, Milpitas, CA (US)

( * ) Notice: Subject to any disclaimer, the term of this patent is extended or adjusted under 35 U.S.C. 154(b) by 0 days.

(21) Appl. No.: 11/618,447

(22) Filed: Dec. 29, 2006

(51) Int. Cl.
*H01R 13/44* (2006.01)
*H01R 13/60* (2006.01)

(52) U.S. Cl. ..................... 439/131; 439/141

(58) Field of Classification Search ............... 439/131, 439/139, 140, 141, 142, 136, 76.1, 528
See application file for complete search history.

(56) References Cited

U.S. PATENT DOCUMENTS

| 5,135,406 | A  | * | 8/1992  | Ishikawa ..................... 439/131 |
| 5,559,672 | A  | * | 9/1996  | Buras et al. ................. 361/684 |
| 6,612,853 | B2 | * | 9/2003  | Wu ............................. 439/136 |
| 6,676,419 | B1 | * | 1/2004  | Lin et al. .................... 439/76.1 |
| 6,979,210 | B2 | * | 12/2005 | Regen et al. ................ 439/131 |
| 7,179,099 | B2 | * | 2/2007  | Hsieh ......................... 439/131 |

* cited by examiner

*Primary Examiner*—Hae Moon Hyeon
(74) *Attorney, Agent, or Firm*—Davis Wright Tremaine LLP

(57) ABSTRACT

A hand held electronic device, such as a flash memory drive, includes a mechanism for extending and withdrawing a connector, such as a USB plug, that is adapted for engaging a mating connector of a host device. A positive latch holds the connector with respect to an outer shell when in the extended and withdrawn positions. Movement of a separate housing portion unlatches the connector and outer shell, and also provides movement of the connector. A protective door closes over a connector opening when the connector is withdrawn into the device, and the door is withdrawn into the device when the connector is extended, thereby not interfering with the extended connector.

12 Claims, 12 Drawing Sheets

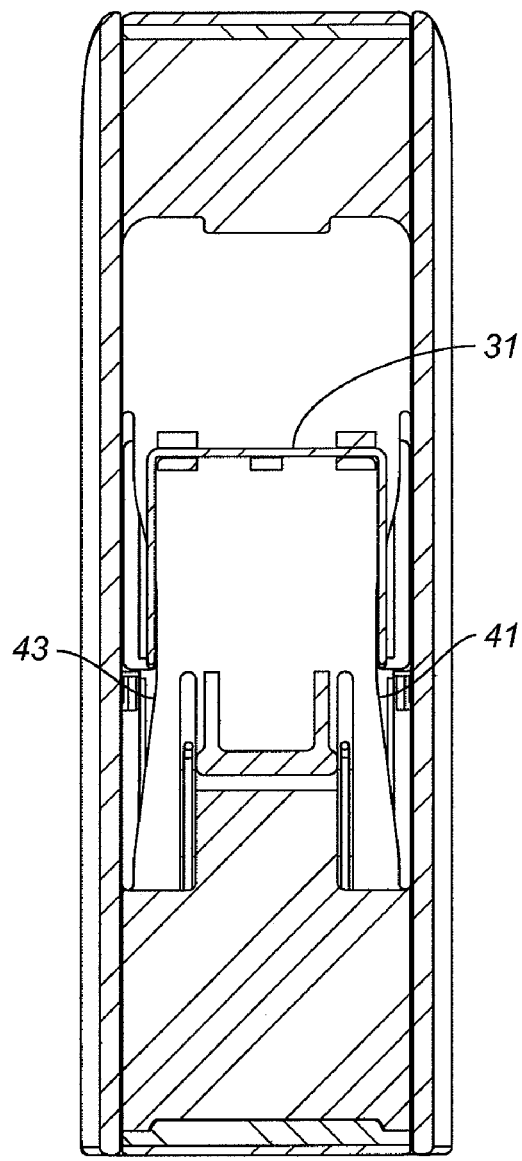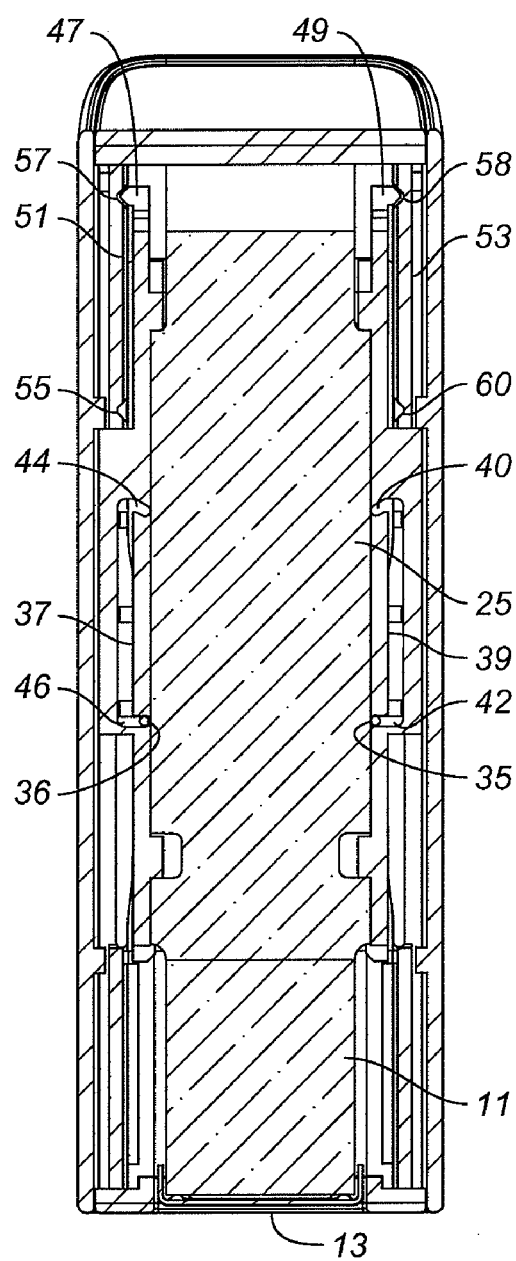
FIG. 3D  FIG. 3E

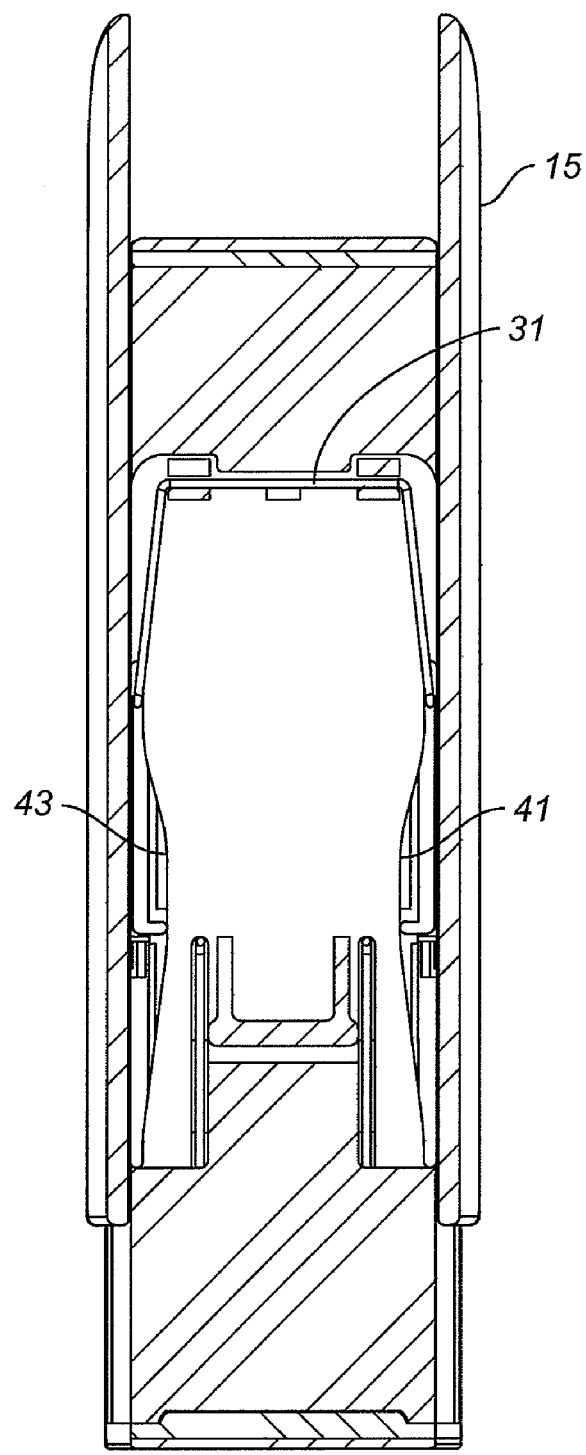
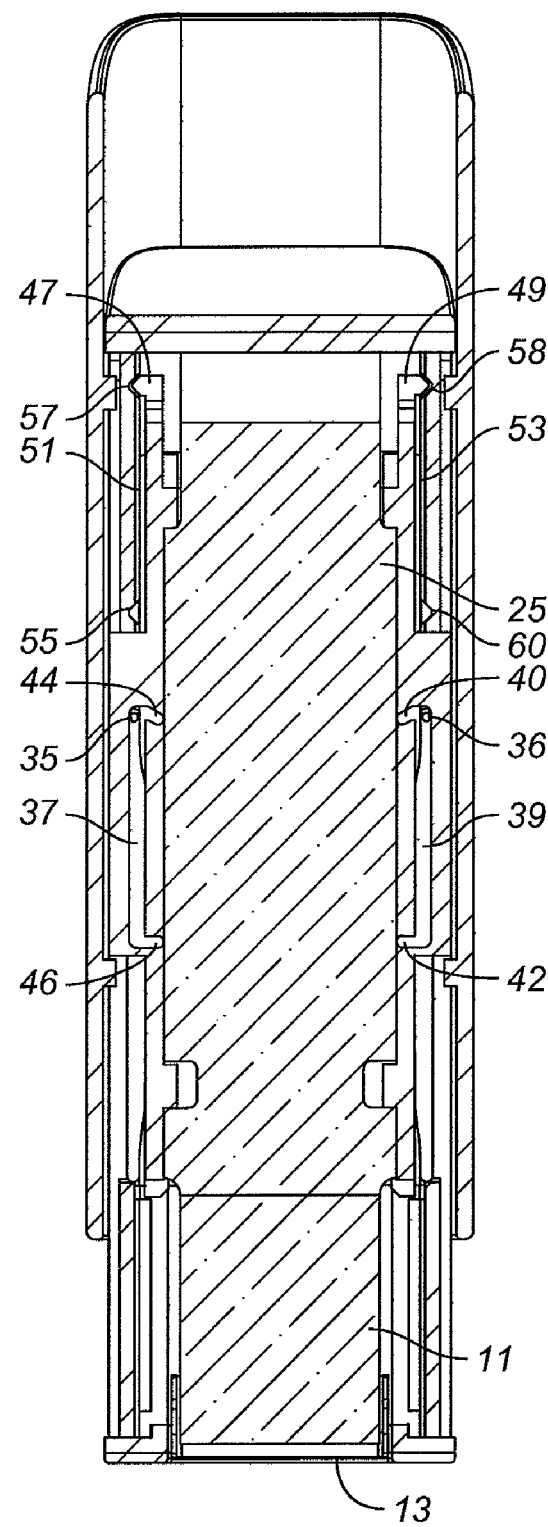
FIG. 6D  FIG. 6E

ELECTRONIC DEVICE WITH A RETRACTABLE CONNECTOR AND PROTECTIVE DOOR MECHANISM

CROSS-REFERENCE TO RELATED APPLICATION

This is related to another application filed by Morganstern et al. concurrently herewith, entitled "Electronic Device with Dual Slide Actuator that Extends and Retracts a Connector."

BACKGROUND

This application relates generally to hand-held electronic devices, such as flash drives containing non-volatile flash memory, that individually include a mating plug, such as an electrical plug following the Universal Serial Bus (USB) standard, that allows removable connection of the devices with host systems.

A type of non-volatile semiconductor flash memory, commonly called a flash drive, is a small hand-held portable device that contains a USB plug as an integral part of it. The USB plug is inserted during use into a USB receptacle of a host system such as a personal computer (PC), notebook computer, portable digital assistant (PDA) and the like. The memory system within the flash drive is electrically connected to the host system through the USB connector plug for transferring data therebetween. The memory system also receives operating power through the USB connector plug. The USB connector plug conforms to the Universal Serial Bus Specification, chapter 6 of Revision 2.0 including mechanical specifications for the connectors. A line of USB flash drives is sold by SanDisk Corporation, assignee of the present application, under its Cruzer trademark.

One class of flash drives includes caps for the user to place on the USB connector plug when the device is not being used, in order to exclude dust and other particulate material from entering openings of the plug. Such caps are most commonly simple plastic coverings that are easily slipped on and off the plug by hand. Some removable caps, however, are provided with a more positive attachment mechanism that removably latches them to the plug. Such caps are commonly lost by users of flash drives when removed from the USB plug.

Another class of flash drives includes a mechanism that allows the user to withdraw the USB plug into the body of the flash drive when not in use. The plug assembly, including a flash memory module, are made to be slidable along the length of the flash drive body between extreme positions, one position being where the USB plug extends out of an end of the body a sufficient distance to be inserted into a mating receptacle of a host system, and the other extreme position being where the plug is withdrawn entirely into the body. SanDisk flash drives sold under the Cruzer Titanium and Cruzer Micro trademarks include such a sliding mechanism. A knob attached to the sliding mechanism extends out through an elongated opening on the top of the flash drive body so that it may be easily manipulated by hand to extend and withdraw the plug through another opening at an end of the body. The mechanism is positively held with respect to the body when in the fully extended and fully withdrawn positions by a resiliently engaged detent that is released by the user pushing the knob into the body at the same time as the knob is urged to extend or withdraw the mechanism from the end opening of the body.

SUMMARY

In order to protect the device from dust and other contaminants when the connector is withdrawn into the device, a cover or door is provided over an opening through which the connector is withdrawn. A door mechanism causes the door to be moved out of the way as the connector is extended from the device, such as by rotation about a pivot, and is then moved back into position over the opening in response to the connector being withdrawn back into the device, such as by a resilient force acting to rotate the door back into a closed position. The door is also withdrawn into the device in response to the connector being extended out of the device, so that the door does not interfere with the operation of the connector.

In accordance with the USB connector specifications, for example, a plug is required to be a certain length for insertion into a mating receptacle. If the door is merely swung out of the way as the connector plug is extended out of the device, it will lie along a portion of the length of the extended plug adjacent the device. This portion of the plug is therefore typically not useable for insertion into a mating receptacle. Therefore, in such a case, the plug is made to be longer than required by the USB specifications. By withdrawing the cover into the device as described herein, on the other hand, the connector need not be made longer than required by the specifications in order to accommodate the protective door.

Additional aspects, advantages and features of the present invention are included in the following description of an exemplary example thereof, which description should be taken in conjunction with the accompanying drawings.

All patents, patent applications, articles, books, specifications, other publications, documents and things referenced herein are hereby incorporated herein by this reference in their entirety for all purposes. To the extent of any inconsistency or conflict in the definition or use of a term between any of the incorporated publications, documents or things and the text of the present document, the definition or use of the term in the present document shall prevail.

BRIEF DESCRIPTION OF THE DRAWINGS

FIGS. 3A-3E show details of the electronic device with its parts in the positions shown in FIG. 1A, FIG. 3A being a plan view and FIG. 3B a side view of the outside of the device, FIG. 3C being a sectional view taken at section 3C-3C of FIG. 3A, FIG. 3D being a sectional view taken at section 3D-3D of FIG. 3B, and FIG. 3E being a sectional view taken at section 3E-3E of FIG. 3B;

FIGS. 6A-6E show details of the electronic device with its parts in the positions shown in FIG. 1D, FIG. 6A being a plan view and FIG. 6B a side view of the outside of the device, FIG. 6C being a sectional view taken at section 6C-6C of FIG. 6A, FIG. 6D being a sectional view taken at section 6D-6D of FIG. 6B, and FIG. 6E being a sectional view taken at section 6E-6E of FIG. 6B.

DETAILED DESCRIPTION OF EXEMPLARY EMBODIMENTS

Figure 1:
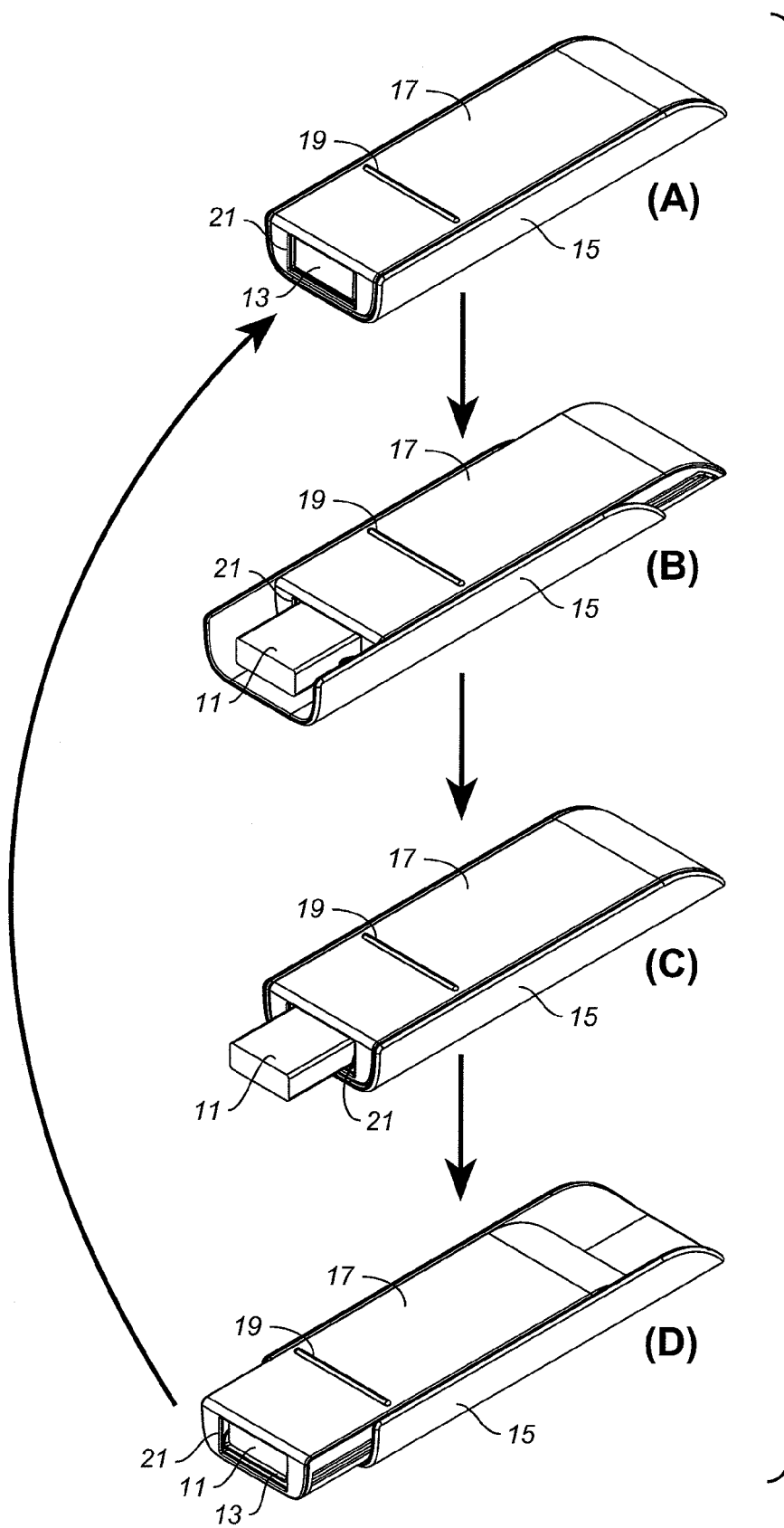
FIG. 1 shows an exemplary electronic device with its major moving parts in four different combinations of positions A, B, C and D.

Referring initially to FIG. 1, an example electronic device, such as a flash drive, has a connector 11, such as a USB plug, that is desired to be moved between a storage position within the device (FIG. 1A) during non-use and an active position extending outward (FIG. 1C) for insertion into a mating connector, such as a USB receptacle, of some other electronic system or device, such as a personal or notebook computer. When the connector 11 is withdrawn, a door 13 (FIG. 1A) moves into place to cover the end of the connector 11. The connector 11 is thereby well protected when the device is not being used.

The device illustrated in FIGS. 1A-1D has three major parts. One is an outer shell 15, preferably elongated as shown. A second is an elongated housing 17 that is slideable by hand back-and-forth along the length of the outer shell 15, between the extreme positions shown in FIGS. 1B and 1D. A ridge 19 on the top surface of the housing 17 facilitates the user gripping the housing with a thumb or finger to provide motion to the housing 17 with respect to the outer shell, while the device is held by one hand. An opening 21 at an end surface of the housing 17 allows the connector 11 to be extended out of the housing.

A third major part of the device is a connector assembly including the connector 11 and, preferably, a printed circuit board (PCB) on which one or more integrated circuits and other electronic components are mounted (not shown in FIGS. 1A-1D) to provide the electronic function, such as a non-volatile memory, to which contacts of the connector 11 are electrically connected. The connector assembly is elongated along the length of the housing 17 and carried within the housing in a manner to be slideable back-and-forth along its length. The slideability of the three parts with respect to each other is restricted, however, in the manner described below.

One stable position of the device is illustrated in FIG. 1A. The connector 11 is withdrawn into the housing 17 for storage, and the door 13 is shut. The connector assembly is latched to the shell 15 to prevent its movement. In order to release this attachment, in preparation to extending the connector 11 out of the device, the housing 17 is moved backward along the shell 15 to a position shown in FIG. 1B. In addition to the connector assembly being released when the housing is in this position, the housing 17 becomes attached to the connector assembly. This then allows the connector 11 to be pushed outside the device into a second stable position, shown in FIG. 1C, by moving the housing forward along the length of the shell 15. At this position, the connector assembly is again latched to the shell 15. The connector 11 may then be inserted into and withdrawn from a mating connector on another device or system by the user holding the body of the device with one hand.

When it is desired to withdraw the connector 11 back into the housing 17, the housing is pushed forward from the position of FIG. 1C to the position shown in FIG. 1D to release the latch of the connector assembly to the shell 15. The attachment of the housing 17 to the connector assembly, established when in the position of FIG. 1B, is broken by enough lateral force being applied to the housing 17 to begin this motion. Since the connector assembly is latched to the shell 15 when in the position of FIG. 1C, this lateral force is applied to the housing 17 relative to both the connector assembly and the shell 15. When in the position of FIG. 1D, the housing 17 is again attached to the connector assembly, while the latch of the connector assembly to the shell 15 has been released. This then allows the housing 17 and connector assembly to be withdrawn as a unit into the shell 15, returning to the position shown in FIG. 1A, where the connector assembly again becomes latched to the shell 15.

The door 13 is optional but preferably provided as part of the device in order to restrict movement of dust and other debris into the device when its parts are in the position shown in FIG. 1A, during non-use of the device. The door 13 is resiliently hinged in a manner that it is rotated downward by the connector 11 when the connector is extended out of the housing 17. This occurs when moving from the position of FIG. 1A to the position of FIG. 1B. The door 13 returns to the closed position, under urging of a resilient force, when the connector is moved back into the housing 17. This occurs when moving from the position of FIG. 1D to that of FIG. 1A.

But rather than attaching the door 13 to the housing 17 at an edge of its end opening 21, it is preferably carried by a separate element that is moveable along the length of the housing 17 to retract the door 13 into the housing 17 when the connector 11 is extended to the position shown by FIG. 1C. This makes the full length of the connector 11 available for connection with a mating connector of a host device. A USB plug, for example, is required by the USB standard to have a specified unobstructed length for insertion into a mating receptacle. If the door 13 was attached to an edge of the housing opening 21 to simply be swung out of the way when the connector 11 is pushed through the opening, the door would extend along a portion of the underside of the connector 11 and thus require that the connector 11 be made longer in order to provide the unobstructed length required by the USB standard. Therefore, the element to which the door 13 is attached is pulled into the housing 17 when the housing is moved from the position of FIG. 1B to that of FIG. 1C. Similarly, this element is moved back to its original position when the housing 17 is moved from the position of FIG. 1D to the position of FIG. 1A.

Structural details of the mechanisms that function as described above are shown in the remaining figures. Initially, the main parts of the device illustrated in FIGS. 1A-1D are shown in the exploded views of FIGS. 2A and 2B. The housing 17 is conveniently formed of a top portion 17a and a bottom portion 17b that are attached to each other in the assembled device. Within the housing is the connector assembly 23, preferably a unitary structure with the connector 11 at one end and electronic circuits and components (not shown) carried by a remaining portion 25. The portion 25 may include a printed circuit board (PCB) to which one or more integrated circuits, various passive components, and the like, are attached and electrically connected together with each other and to electrical contacts of the connector 11. The primary example of a combination of such components are those that form a flash non-volatile memory system.

Referring again to FIGS. 2A and 2B, the door 13 is attached to ends of legs of a U-shaped metal spring 27 that is moved in and out through the housing opening 21 to withdraw the door 13 into the housing when the connector 11 is extended out of the housing through the opening 21. The door 13 is resiliently urged into the upright position shown. The door 13 is therefore rotated downward to be substantially flat and in the plane of the spring 27 when the connector 11 is moved against and through the door. But when the connector 11 is withdrawn back into the housing 17, the door 13 then resiliently returns to the upright position shown.

Figure 2A:
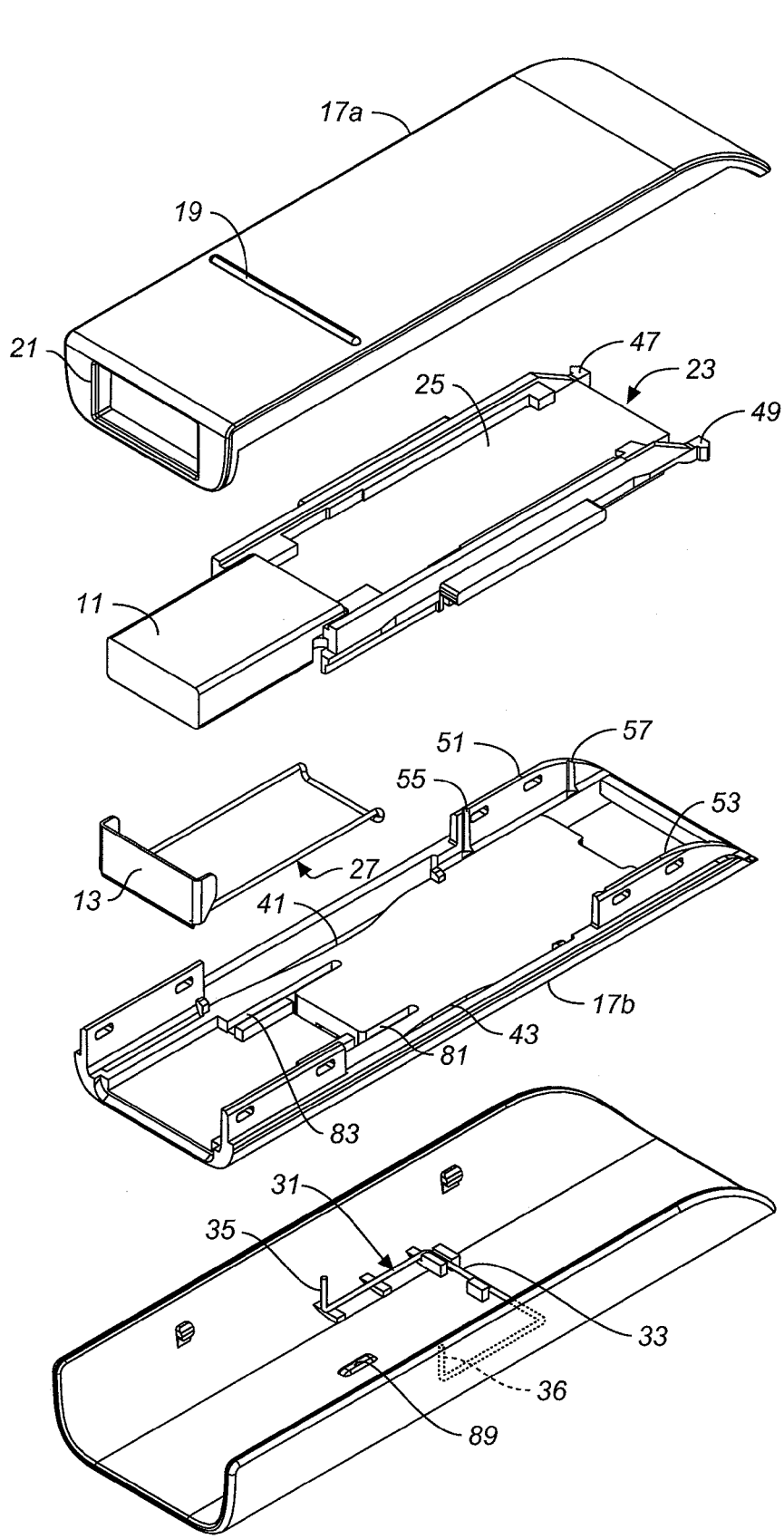
FIGS. 2A and 2B are exploded views of the electronic device shown FIG. 1, FIG. 2A viewing the major components from a top right-hand position and FIG. 2B from a lower right-hand position.

The controllable latching of the connector assembly 23 to the shell 15 described above is provided, in this example, by a U-shaped spring element 31 having a portion 33 attached to an inside surface of the outer shell 15 (see FIG. 2A). Ends 35 and 36 of the legs of the spring 31 (only leg 35 is visible in FIG. 2A) are turned up to ride along respective parallel planar surfaces 37 and 39 on opposite sides of the connector assembly 23. At opposite ends of the surface 37 are inwardly extending notches 44 and 46. Similarly, notches 40 and 42 are provided at opposite ends of the surface 39. The upturned ends 35 and 36 of the spring 31 move along surfaces 37 and 39, respectively, as the connector assembly 23 is moved back-and-forth along the length of the shell 15. The legs of the spring 31 are resiliently biased inward in a manner that the ends 35 and 36 are normally urged against the surfaces 37 and 39, and thus move into the notches when positioned opposite them. The notches may be formed at substantially right angles to the surfaces 37 and 39, so that the spring ends 35 and 36 are positively latched when positioned in them. It is preferable, however, to form the rear notches 40 and 44 with slight angles toward the connector 11, in order to more positively hold the spring ends 35 and 36 against being disengaged unintentionally from the connector assembly 23. Movement of the connector assembly 23 with respect to the shell 15 is thereby prevented until the spring ends are moved out of the notches.

This positive latch occurs when the parts are moved into the positions of either of FIGS. 1A and 1C, as shown in respective cross-sectional views of FIGS. 3D, 3E and 5D, 5E. The ends 35 and 36 of the spring 33 also protrude upward through slots in the housing portion 17b that are bounded by respective cam surfaces 41 and 43. These cam surfaces are in the shape of inwardly extending arcs, with the width of the housing portion 17b being a minimum in the middle of the arcs and a maximum at the ends of the arcs. When the housing portion 17b is positioned with respect to the shell 15 to cause either end of the cam surfaces 41 and 43 to carry the spring ends 35 and 36, the spring ends are urged outward to remove them from the notches, thereby to uncouple the connector assembly 23 and the shell 15. This occurs when the housing 17 is moved into the positions of either of FIGS. 1B and 1D, as shown in the cross-sectional views of FIGS. 4D, 4E and 6D, 6E, respectively.

The connector assembly is moved by application of hand motion to the housing 17, as described above. A controllable connection between the housing 17 and the connector assembly 23 is therefore desired for this purpose. This is provided, in this example, by protrusions 47 and 49 on ends of short plastic arms that are part of the connector assembly 23, and mating detents on inside surfaces of respective walls 51 and 53 of the housing portion 17b. Detents 55 and 57 are formed on the wall 51, as shown in FIG. 2A. Detents 58 and 60 are also provided on an inside of the wall 53. This connection between the housing 17 and connector assembly 23 allows the connector assembly to be moved by moving the housing. Such movement includes that described above between FIGS. 1B and 1C, and again between FIGS. 1D and 1A. The protrusions 47, 49 and respective detents 55, 57 and 58, 60 are also cooperatively shaped to allow the connection between the housing and connector assembly to be broken upon application of sufficient lateral force to the housing when the connector assembly 23 is latched to the shell 15 through the spring 31. This connection is broken at the commencement of motion between positions of FIGS. 1A and 1B, and again when movement is begun between FIGS. 1C and 1D.

Figure 3A:
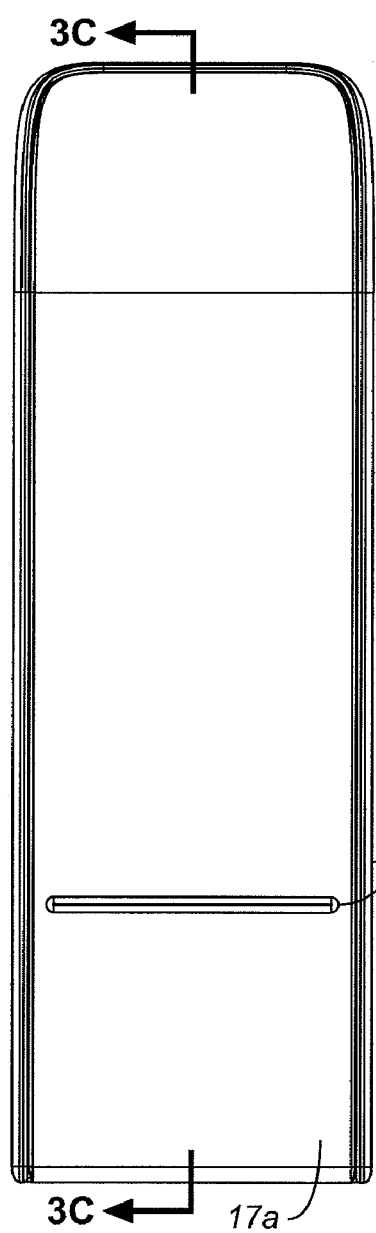
Figure 3B:
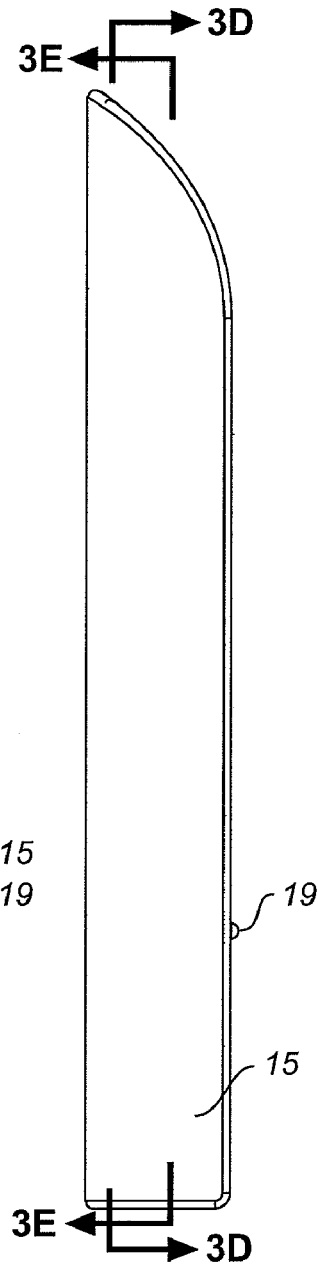
Figure 6A:
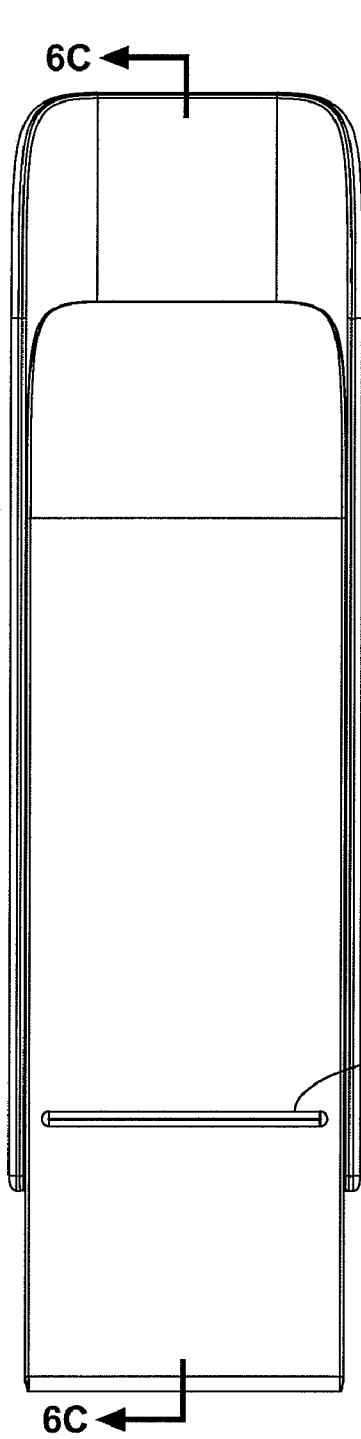
Figure 6B:
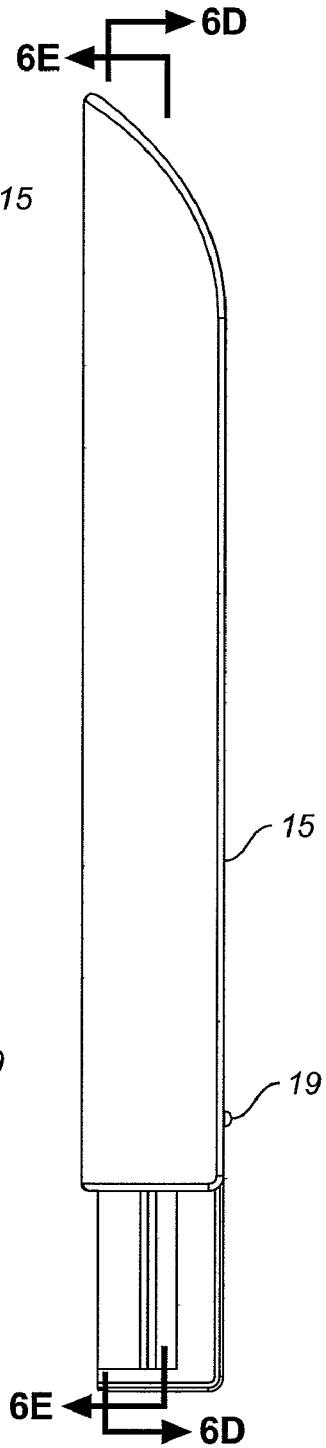

As shown best by the cross-sectional views of FIGS. 3E and 6E, the connector assembly protrusions 47 and 49 are resiliently urged outward into a first pair of respective housing detents 57 and 58 to attach the connector assembly 23 to the housing 17 in a first position. A second attachment position is shown best in cross-sectional views of FIGS. 4E and 5E, where the connector assembly protrusions 47 and 49 engage respective housing detents 55 and 60. The connector assembly thereby has positions of stable connection with the housing, the position being changed by applying lateral hand movement to the housing when the connector assembly is latched to the shell though its spring ends 35 and 36.

Figure 7:
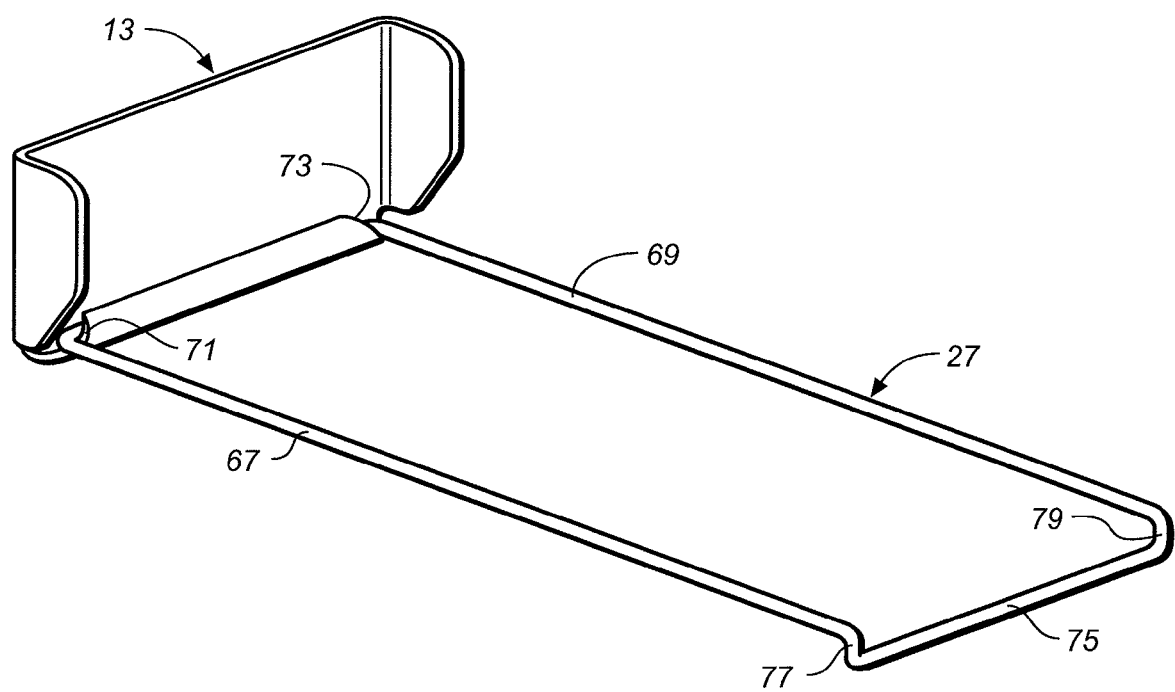
FIG. 7 is an enlarged perspective view of a protective door assembly included in the electronic device of the foregoing figures.

A preferred structure for the door 13 and its supporting spring 27 is shown in FIG. 7. In order to provide the resilient force that biases the door 13 into the upright position, legs 67 and 69 are resiliently biased toward each other. This inward force is applied to respective cam surfaces 71 and 73 of the door 13, which causes the door 13, when unobstructed, to rotate into the upright position shown. But at the same time, the door 13 is rotatable in the opposite direction to open the door when the connector 11 is being moved out of the housing 17.

Figure 2B:
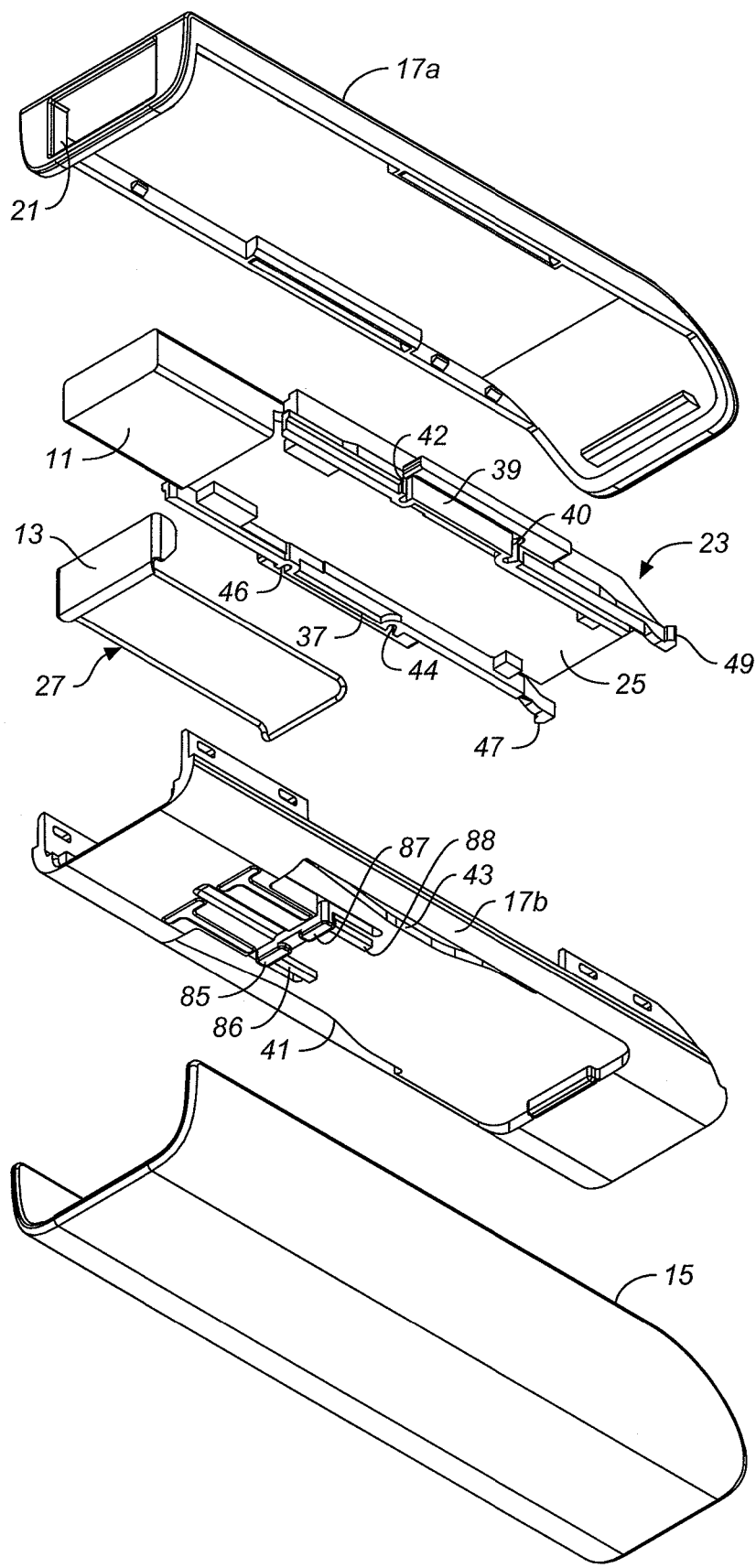

The spring 27 is shaped to work with the housing portion 17b (see FIGS. 2A and 2B) to be moved back and forth with respect to the housing 17 in order to pull the door 13 within the housing when the connector 11 is extended out of the housing in the position of FIG. 1C. Referring to FIG. 7, the legs 67 and 69 of the spring 27 are connected to a crossbar 75 through respective vertical segments 77 and 79. Referring to FIGS. 2A and 2B, the legs 67 and 69 are positioned in respective slots 81 and 83 on an inner surface of the bottom housing portion 17b. The vertical segments 77 and 79 extend through the housing portion 17b at the bottoms of these slots in a manner that the spring 27 may be moved back and forth a constrained distance with respect to the housing portion 17b. The crossbar 75 is positioned, under the housing portion 17b behind protrusions 85 and 87 that extend from the bottom of the housing portion 17b. (That is, to the right of the protrusions 85 and 87 in the view of FIG. 2B.)

Figure 3C:
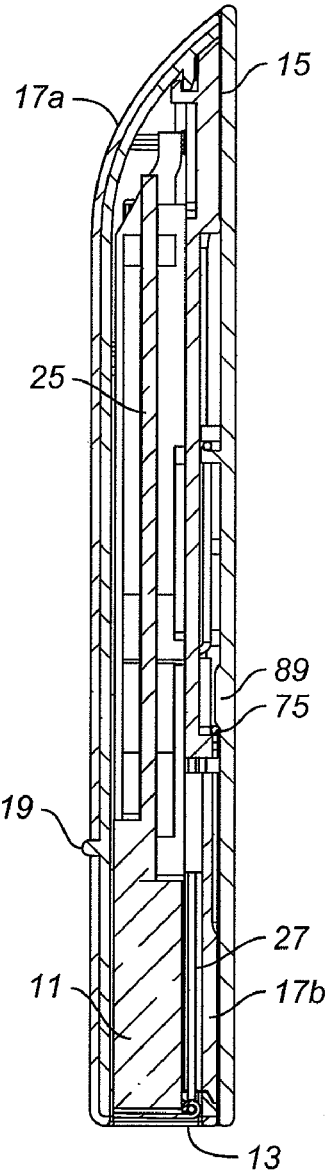
Figure 4A:
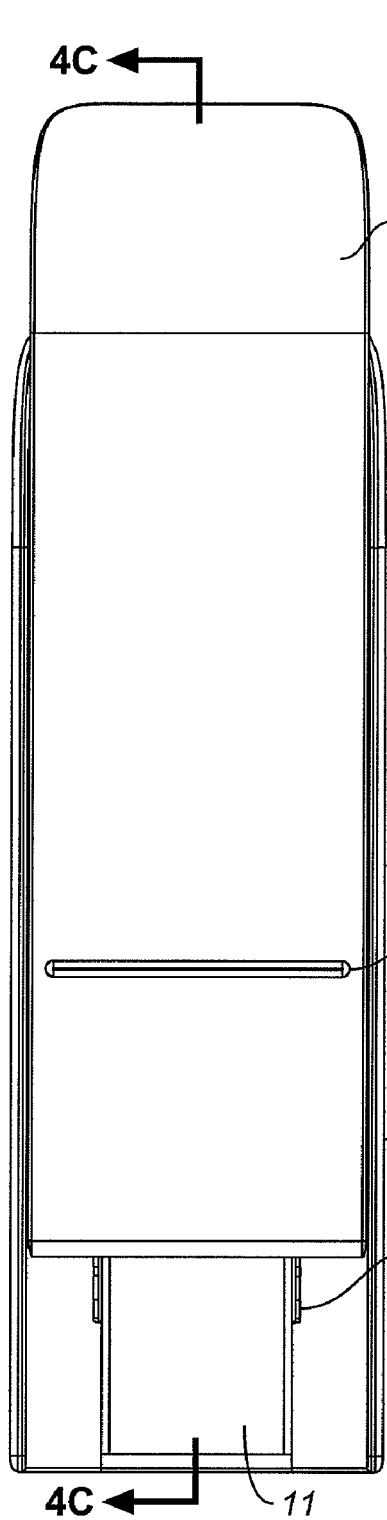
FIGS. 4A-4E show details of the electronic device with its parts in the positions shown in FIG. 1B, FIG. 4A being a plan view and FIG. 4B a side view of the outside of the device, FIG. 4C being a sectional view taken at section 4C-4C of FIG. 4A, FIG. 4D being a sectional view taken at section 4D-4D of FIG. 4B, and FIG. 4E being a sectional view taken at section 4E-4E of FIG. 4B.
Figure 4B:
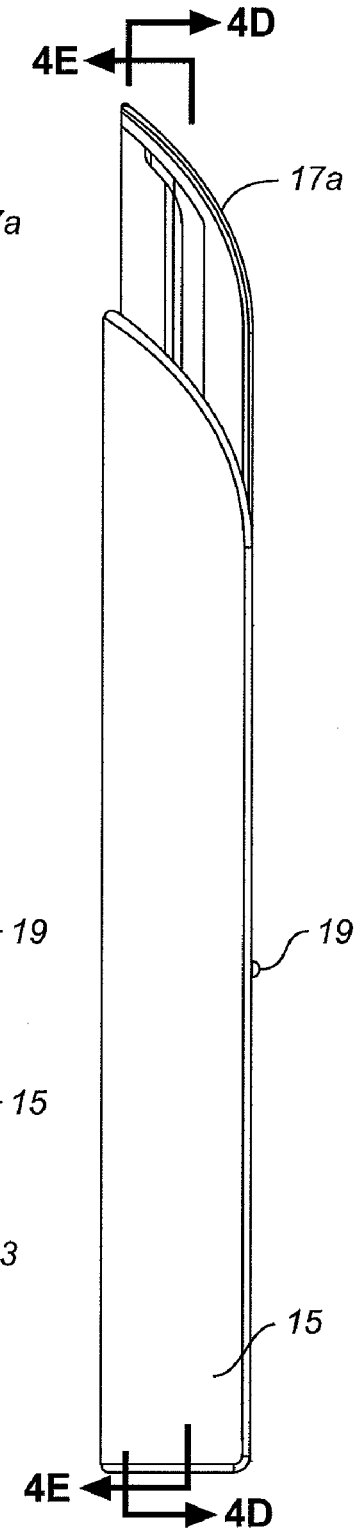
Figure 4C:
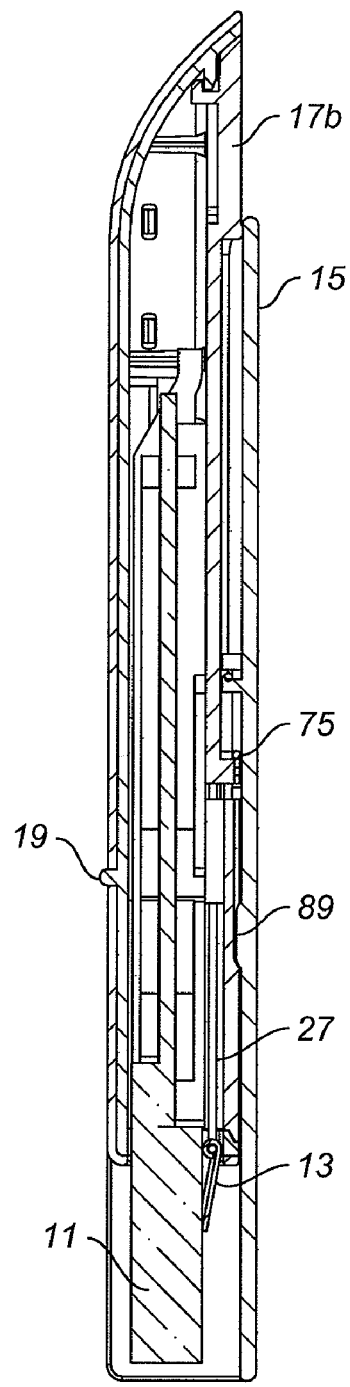
Figure 4D:
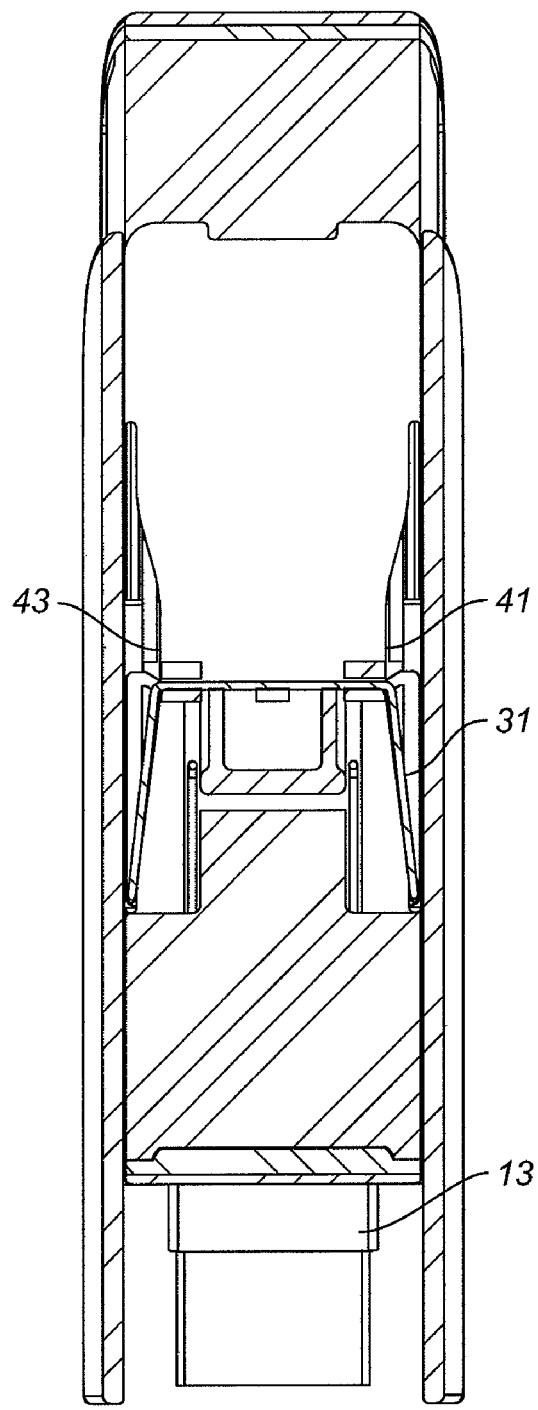
Figure 4E:
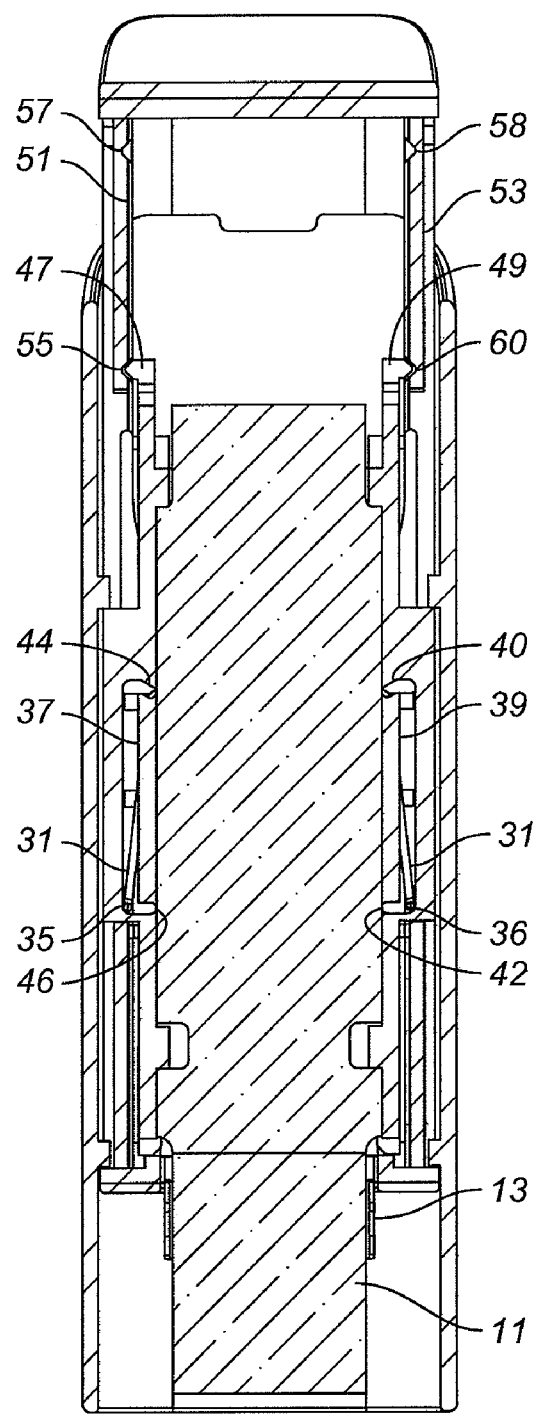

A bump 89 formed on the inside of the outer shell 15 (FIG. 2A) is provided to restrain undesired movement of the crossbar 75 when the housing 17 is moved with respect to the shell 15. The positive pull of the protrusions 85 and 87 causes the crossbar 75 to move across the bump 89 when the housing 17 is moved from the position of FIG. 1A to that of FIG. 1B. (See also the cross-sectional views of FIGS. 3C and 4C.)

Figure 5A:
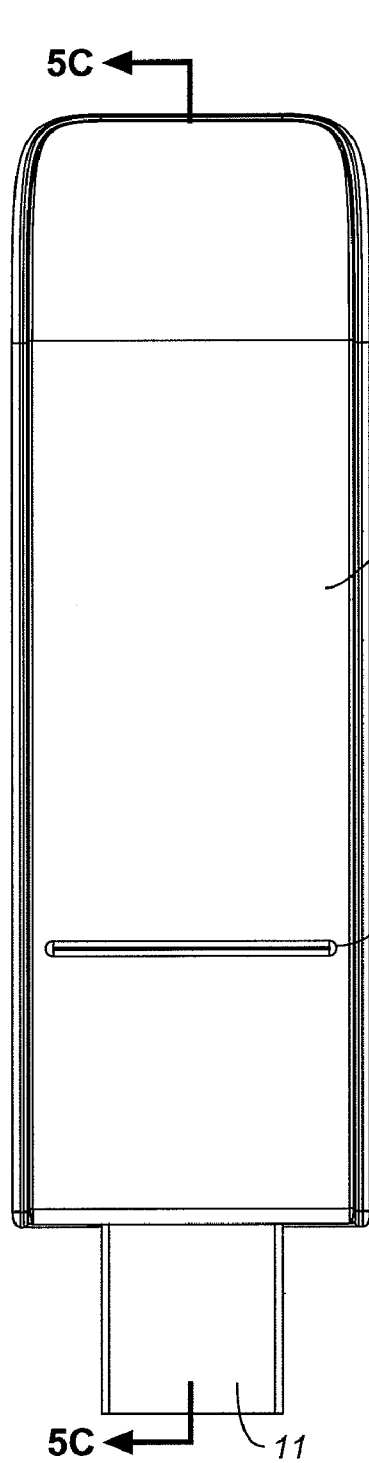
FIGS. 5A-5E show details of the electronic device with its parts in the positions shown in FIG. 1C, FIG. 5A being a plan view and FIG. 5B a side view of the outside of the device, FIG. 5C being a sectional view taken at section 5C-5C of FIG. 5A, FIG. 5D being a sectional view taken at section 5D-5D of FIG. 5B, and FIG. 5E being a sectional view taken at section 5E-5E of FIG. 5B.
Figure 5B:
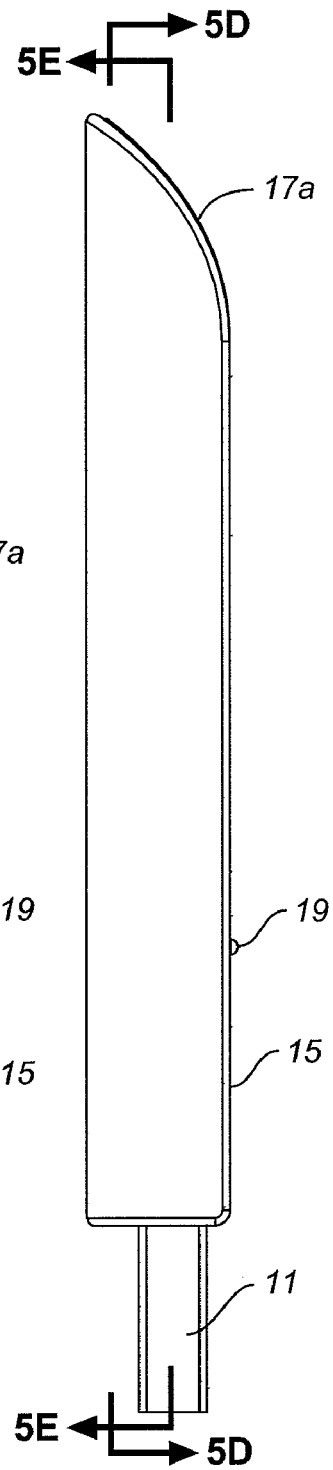
Figure 5C:
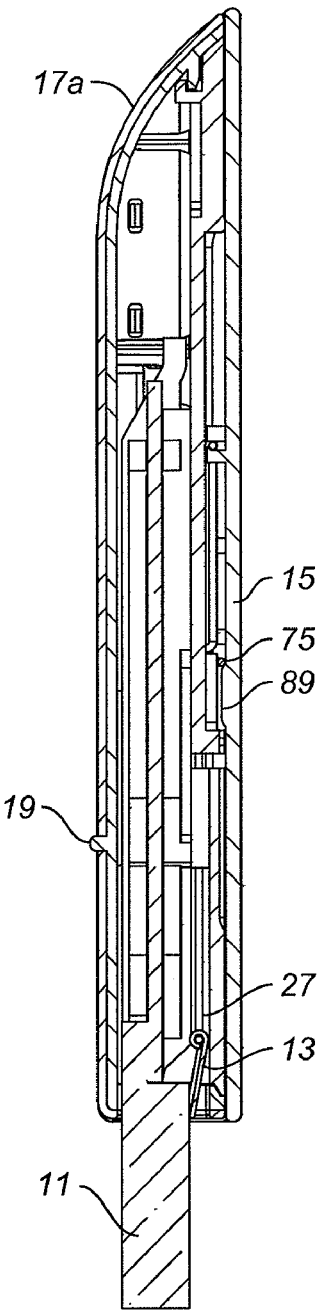
Figure 5D:
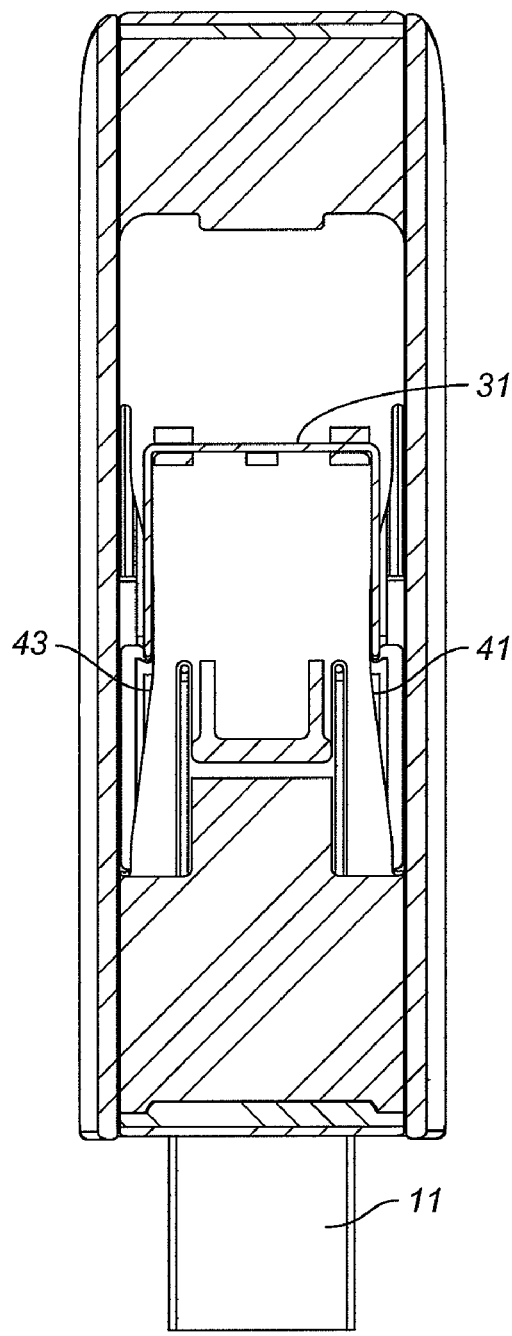
Figure 5E:
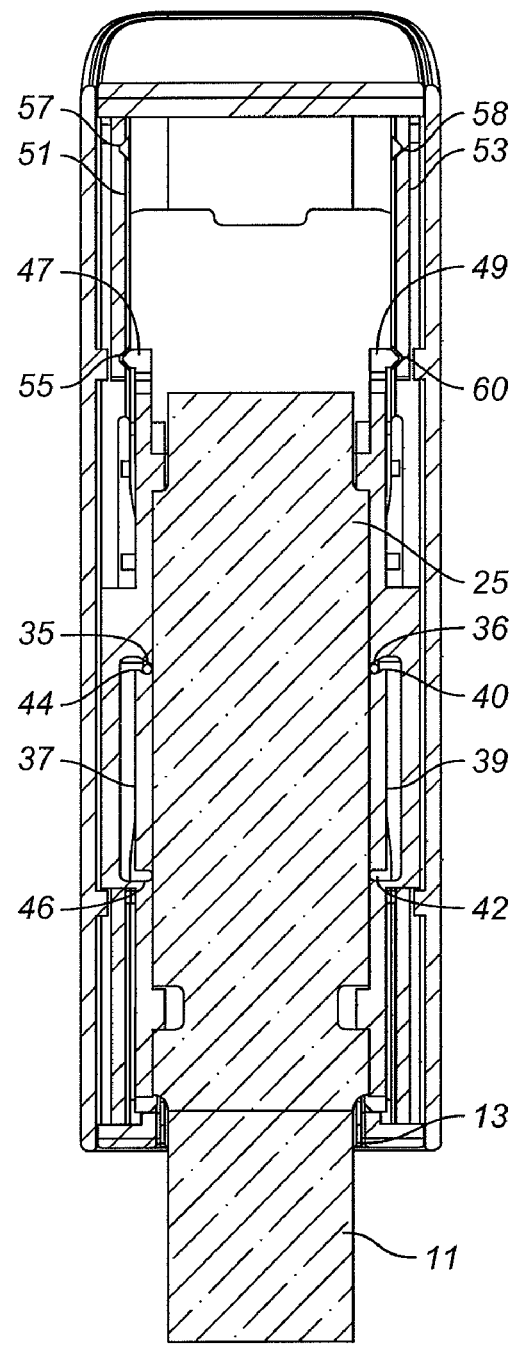

Although the spring 27 moves a distance with the housing 17 as the housing is moved from the position of FIG. 1B to that of FIG. 1C (see also the cross-sectional views of FIGS. 4C and 5C), the bump 89 restrains movement of the crossbar 75 so that the door 13 does not extend out of the housing 17 when the connector 11 is fully extended from the device (FIG. 1C). This restraint is caused by resiliently mounted rails 86 and 88, immediately behind the protrusions 85 and 87 on the underside of the housing 17, pushing down on the crossbar 75 as the housing is moved forward with respect to the shell 15. This provides the desirable result of maintaining the door 13 within the housing 17 when the connector 11 is extended, so that it does not interfere with the connector.

Figure 6C:
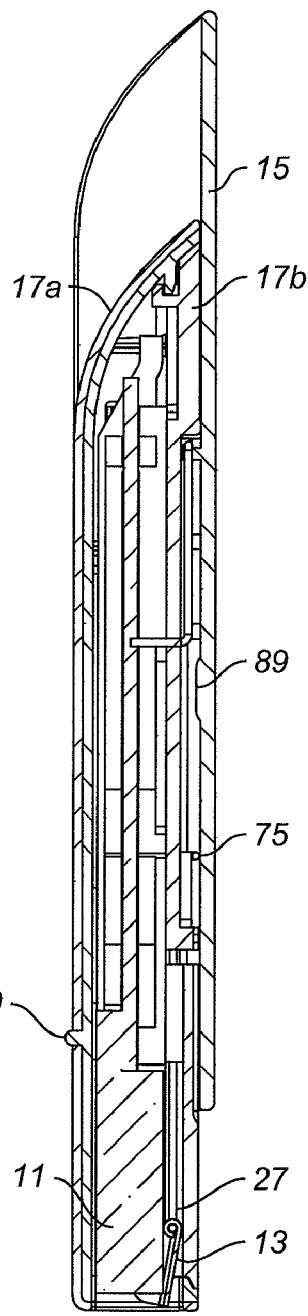

When the housing 17 is moved from the position of FIG. 1C to that of FIG. 1D, ends of the slots 81 and 83 engage the vertical segments 77 and 79 to positively push the spring crossbar 75 forward over the bump 89. (See also the cross-sectional views of FIGS. 5C and 6C.) As the housing 17 is pulled back from the position of FIG. 1D to that of FIG. 1A, the spring 27 is pushed forward with respect to the housing by an inherent frictional connection with the outer shell 15. If this friction is not sufficient, the bump 89 on the shell 15 advances the spring 27 to fully extend the door 13 out of the housing opening 21 as the shell is moved forward with respect to the housing. (See also the cross-sectional views of FIGS. 6C and 3C.) The door 13 is then allowed to spring back into its protective position shown in FIG. 1A.

Although the various aspects of the present invention have been described with respect to exemplary embodiments thereof, it will be understood that the present invention is entitled to protection within the full scope of the appended claims.

It is claimed:

1. A portable electronic device, comprising:
   a housing that includes an opening,
   an electrical connector assembly carried by the housing and moveable with respect thereto between a first position wherein the connector extends outside of the housing through its opening and a second position wherein the connector is withdrawn into the housing, and
   a door mechanism including a door resiliently carried by an end of an element that is slideable with respect to the housing, and wherein (1) in response to movement of the connector assembly from the first to the second position, the element moves to a position wherein its end is adjacent the housing opening and the door is resiliently urged about the element end to cover the housing opening, and (2) in response to movement of the connector assembly from the second to the first position, the element moves to another position where the element end is withdrawn into the housing a sufficient distance so that the door is also withdrawn within the housing while being urged against the resilience at the element end.

2. The device of claim 1, wherein the element includes a wire having a pair of legs having one end connected to the door in a manner that a resilient force of the legs with respect to each other causes the door to rotate to a position substantially perpendicular to the wire legs.

3. The device of claim 1, wherein the element includes a wire having a pair of legs with one end connected to the door and another end shaped with segments substantially perpendicular to the legs and a crossbar joining the segments a distance from the legs, the element being carried by a wall of the housing with the element motion including sliding the element legs in slots in one surface of the wall, the element segments additionally extending through apertures in the wall so that the element motion includes sliding the crossbar along an opposite surface of the wall.

4. The device of claim 1, additionally comprising one or more integrated circuits positioned within the housing that form a non-volatile memory that is electrically connected with the connector.

5. The device of claim 1, wherein the connector assembly additionally includes one or more integrated circuits forming a non-volatile memory that is electrically connected with the connector.

6. The device of claim 1, wherein the connector of the connector assembly includes an USB plug.

7. A portable electronic device, comprising:
   an elongated outer shell,
   a housing that is moveable along the length of the shell and which has an opening at one end thereof,
   an electrical connector assembly carried by the housing and moveable with respect to the housing between one position extending the connector outside of the housing through its opening and another position where the connector is withdrawn into the housing,
   wherein the housing is also moveable with respect to the outer shell between one position extending the connector outside of the outer shell and another position wherein the connector is withdrawn into the outer shell,
   a door mechanism including a door carried by an element that in turn is slideably carried by the housing with a portion thereof extending to an outside of the housing adjacent an inside surface of the outer shell,
   abutments on the housing that engage the element to move the element along the length of the outer shell, and
   a protrusion on the inside surface of the outer shell that restricts motion of the element when there is relative motion between the housing and outer shell but no engagement of the element with the housing abutments.

8. The device of claim 7, wherein the element includes a wire having a pair of legs with one end thereof connected to the door in a manner that a resilient force of the legs with respect to each other causes the door to be biased in a position substantially perpendicular to the wire legs.

9. The device of claim 7, additionally comprising one or more integrated circuits positioned within the housing that form a non-volatile memory that is electrically connected with the connector.

10. The device of claim 7, wherein the connector assembly additionally includes one or more integrated circuits forming a non-volatile memory that is electrically connected with the connector.

11. The device of claim 7, wherein the connector of the connector assembly includes an USB plug.

12. A flash memory drive, comprising:
    an elongated outer shell,
    an elongated housing that is moveable along a length of the shell and which has an opening at the first end,
    an assembly of a flash memory system and an electrical connector positioned within the housing and moveable along its length between extreme positions extending the connector outside of the housing through its opening and withdrawing the connector to a position within the housing,
    means responsive to movement of the housing and the assembly along the length of the shell for latching the assembly against movement with respect to the shell,
    means responsive to movement of the housing along the length of the shell when latched to the assembly for releasing the latch, means selectively holding the housing to the assembly for allowing the assembly to be moved with respect to the shell by movement of the housing, and means within the housing for covering the housing opening when the connector is withdrawn to the position within the housing and for withdrawing into the housing when the connector is extended to the position outside of the housing.

* * * * *